(12) United States Patent
Kang et al.

(10) Patent No.: US 8,362,624 B2
(45) Date of Patent: Jan. 29, 2013

(54) MULTI-CHIP PACKAGE AND METHOD OF MANUFACTURING THEREOF

(75) Inventors: Tae-Ho Kang, Seoul (KR); Jin-Ho Kim, Cheonan-si (KR); Bo-Seong Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/230,052

(22) Filed: Sep. 12, 2011

(65) Prior Publication Data

US 2012/0139125 A1 Jun. 7, 2012

(30) Foreign Application Priority Data

Dec. 6, 2010 (KR) .................. 10-2010-0123592

(51) Int. Cl.
*H01L 23/48* (2006.01)
*H01L 23/02* (2006.01)
*H01L 21/00* (2006.01)

(52) U.S. Cl. ........ 257/774; 257/777; 257/778; 257/678; 257/686; 438/109; 438/106; 438/127

(58) Field of Classification Search .......... None
See application file for complete search history.

(56) References Cited

U.S. PATENT DOCUMENTS

| | | | |
|---|---|---|---|
| 6,353,263 B1 * | 3/2002 | Dotta et al. | 257/777 |
| 7,323,769 B2 | 1/2008 | Tan et al. | |
| 2005/0156323 A1 * | 7/2005 | Tokunaga | 257/778 |
| 2005/0194673 A1 * | 9/2005 | Kwon et al. | 257/686 |
| 2007/0018296 A1 * | 1/2007 | Kwon et al. | 257/678 |
| 2007/0108562 A1 * | 5/2007 | Song et al. | 257/666 |
| 2008/0179757 A1 * | 7/2008 | Yamamori et al. | 257/777 |
| 2008/0265432 A1 * | 10/2008 | O et al. | 257/777 |
| 2009/0051043 A1 | 2/2009 | Wong et al. | |

FOREIGN PATENT DOCUMENTS

| | | |
|---|---|---|
| JP | 2008-084971 | 4/2008 |
| JP | 2009-252771 | 10/2009 |

\* cited by examiner

*Primary Examiner* — Julio J Maldonado
*Assistant Examiner* — Harpreet Singh
(74) *Attorney, Agent, or Firm* — Muir Patent Consulting, PLLC

(57) ABSTRACT

Provided are a multi-chip package and a method of manufacturing the same, which can facilitate wire bonding even when an upper chip is larger than a lower chip or overhangs a lower chip. A multi-chip package includes a substrate having first and second bonding pads on a top surface thereof, a first chip connected to the first bonding pads on the substrate, an insulating layer formed on the substrate so as to surround lateral surfaces of the first chip, a set of openings formed in the insulating layer so as to expose the second bonding pads, and a second chip formed on the insulating layer and the first chip, the second chip having a larger area than the first chip and connected to the second bonding pads using wires that pass through the second openings.

20 Claims, 15 Drawing Sheets

MULTI-CHIP PACKAGE AND METHOD OF MANUFACTURING THEREOF

CROSS-REFERENCE TO RELATED APPLICATION

This application claims priority from Korean Patent Application No. 10-2010-0123592 filed on Dec. 6, 2010 in the Korean Intellectual Property Office, and all the benefits accruing therefrom under 35 U.S.C. 119, the contents of which in its entirety are herein incorporated by reference.

BACKGROUND

1. Field

The present disclosure relates to a multi-chip package and a method of manufacturing thereof, and more particularly, to a multi-chip package and a method of manufacturing the same, which can facilitate wire bonding even when an upper chip is larger than a lower chip.

2. Description of the Related Art

Semiconductor packaging technologies are being developed to meet increasing demands for multifunctional, high capacity, and compact semiconductor packages. To achieve this, a system in package (SIP) technology has been proposed to realize a small, slim, multifunctional, high capacity semiconductor package by incorporating a plurality of semiconductor chips or packages into a single semiconductor package The SIP is divided into two categories: Package on Package and Multi-Chip Package (MCP). The Package on Package is formed by vertically stacking individual semiconductor packages subjected to electrical tests. The MCP is capable of mounting a plurality of semiconductor chips in a single semiconductor package.

When an upper chip is larger than a lower chip in a MCP, several failures may occur during wire bonding of a chip pad located at an overhang portion of the upper chip (not supported by the lower chip). More specifically, since a conventional MCP has no configuration or member for supporting the overhang portion of the upper chip, cracks may be created in the upper chip when a large force is applied during wire bonding. Furthermore, applying a small force during wire bonding may cause an incomplete bond.

SUMMARY

The present disclosure provides a semiconductor package, which can facilitate wire bonding even when an upper chip is larger than and/or overhangs a lower chip in a multi-chip package (MCP).

The above and other objects of the present disclosure will be described in or be apparent from the following description of various embodiments.

According to one embodiment, a multi-chip package includes a substrate having first and second bonding pads on a top surface thereof, a first chip connected to the first bonding pads on the substrate, an insulating layer formed on the substrate so as to surround lateral surfaces of the first chip, a set of openings formed in the insulating layer so as to expose the second bonding pads, and a second chip formed on the insulating layer and the first chip, the second chip having a larger area than the first chip and connected to the second bonding pads using wires that pass through respective ones of the openings.

In another embodiment, a multi-chip package includes a substrate having first and second bonding pads on a top surface thereof, a first chip connected to the first bonding pads on the substrate, a support layer formed on the substrate so as to surround one or more lateral surfaces of the first chip, a set of openings formed in the support layer so as to expose the second bonding pads, and a second chip formed on the support layer and the first chip, the second chip having a portion that overhangs the first chip and is connected to the second bonding pads using wires that pass through respective ones of the openings.

In another embodiment, a method of manufacturing a multi-chip package includes forming a substrate having first and second bonding pads on a top surface thereof, mounting a first chip on the substrate and connecting chip pads on the first chip to the first bonding pads on the substrate, forming an insulating layer on the substrate so as to surround lateral surfaces of the first chip, forming a set of openings in the insulating layer so as to expose the second bonding pads, mounting a second chip on the insulating layer and the first chip, the second chip having at least a portion that overhangs the first chip, and connecting chip pads on the second chip to the second bonding pads using wires that pass through respective ones of the openings.

BRIEF DESCRIPTION OF THE DRAWINGS

The above and other features and advantages will become more apparent by describing in detail various embodiments with reference to the attached drawings in which.

DETAILED DESCRIPTION

Figure 1A:
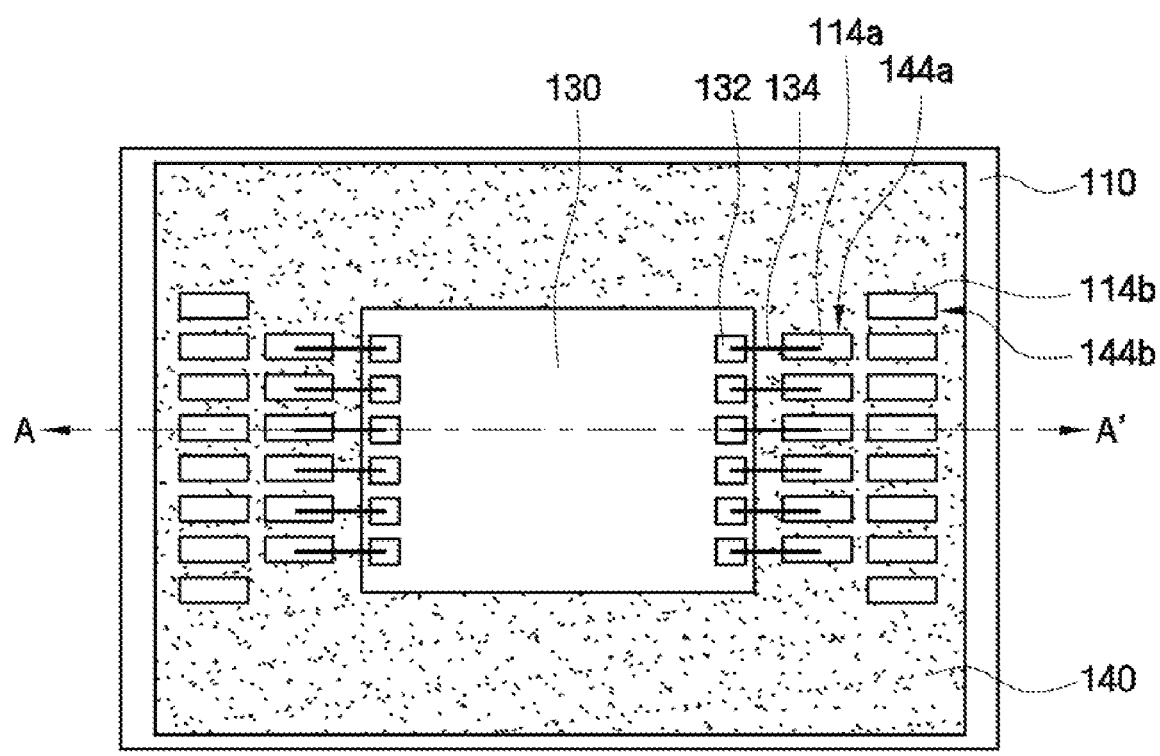
FIGS. 1A through 8 are plan views and cross-sectional views for explaining a method of manufacturing a multi-chip package (MCP) according to one exemplary embodiment.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present invention.

Terms such as "same," "equal," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
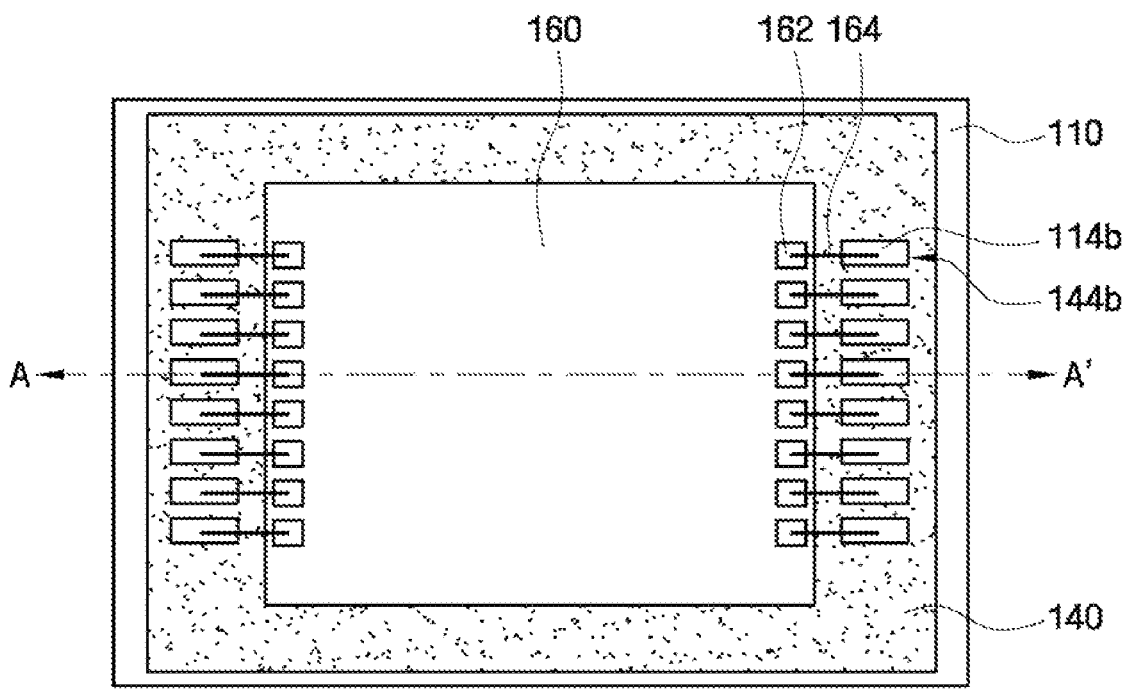

A structure of a multi-chip package (MCP) and a method of manufacturing the MCP according to one exemplary embodiment are described with reference to FIGS. 1A through 8. FIGS. 1A and 1B are plan views for explaining a method of manufacturing a multi-chip package (MCP) according to one embodiment, and FIGS. 2 through 8 are cross-sectional views taken along the line A-A' of FIG. 1a and FIG. 1b for explaining a method of manufacturing a multi-chip package (MCP) according to one embodiment. Specifically, FIG. 1A is a plan view corresponding to a cross-sectional view of FIG. 5, and FIG. 1B is a plan view corresponding to a cross-sectional view of FIG. 7. A method of manufacturing the MCP according to one embodiment will now be described with reference to the plan views and the cross-sectional views of FIGS. 1A through 8 according to one exemplary order in which fabrication processes are performed. The structure of the MCP is also described with reference to FIGS. 1A, 1B, and 8.

Figure 2:
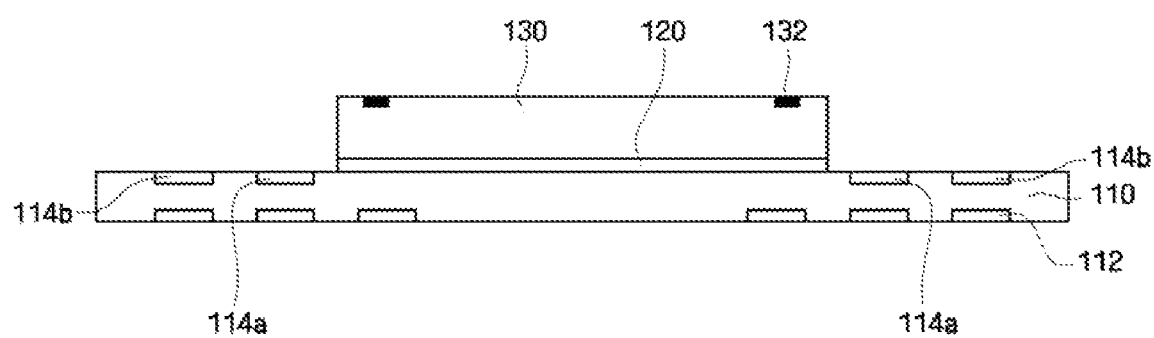

Referring to FIGS. 1A and 2, a substrate 110 is provided. The substrate 110 includes bonding pads 114a and 114b disposed on a top surface thereof and a plurality of external connection terminals 112 disposed on a bottom surface opposite the top surface. The substrate 110 may be, for example, a printed circuit board (PCB) having a circuit pattern, or a ceramic substrate. The substrate 110 may be a wafer-sized substrate or a chip-sized substrate formed by dicing a wafer, such as a silicon wafer, into a plurality of chips. The bonding pads 114a and 114b are intended to electrically connect between circuitry included in the substrate 110 and semiconductor chips 130 and 160, and may comprise terminals made of a conductive material such as, for example, a metal. The external connection terminals 112 serve to electrically connect the MCP according to one embodiment with an external device such as a motherboard or another semiconductor package (See, e.g., FIG. 8). The external connection terminals may also be pads comprised of conductive material that connects to circuitry included in the substrate 110.

Hereinafter, for convenience of explanation, the bonding pads 114a connected to a lower one 130 (hereinafter called a "first semiconductor chip") of the semiconductor chips 130 and 160 is referred to as the first bonding pads 114a. The bonding pads 114b connected to an upper one 160 (hereinafter called a "second semiconductor chip") of the semiconductor chips 130 and 160 is referred to as the second bonding pads 114b. In one embodiment, a plurality of first bonding pads 114a are arranged at opposite sides of the first semiconductor chip 130 in a horizontal direction. Similarly, a plurality of second bonding pads 114b are arranged at opposite sides of the second semiconductor chip 160 in the horizontal direction. In one embodiment, the first bonding pads 114a and the second bonding pads 114b are respectively disposed at opposite sides of the first and second semiconductor chips 130 and 160 in the same direction such as A-A' direction. Thus, the second bonding pads 114b are disposed outside the first bonding pads 114a. However, the first bonding pads 114a and the second bonding pads 114b are not limited thereto and may be arranged, for example, at the opposite sides of the first and second semiconductor chips 130 and 160 in different directions, e.g., an A-A' direction and a direction perpendicular to the A-A' direction, respectively, which will be described in more detail below with reference to FIGS. 9A and 9B. After providing the substrate 110, the first semiconductor chip 130 is formed on the top surface of the substrate 110. More specifically, the first semiconductor chip 130 may be attached to the top surface of the substrate 110 by an insulating adhesive

120. The first semiconductor chip 130 also includes chip pads 132 formed on a top surface thereof Referring to FIGS. 1A and 3, an insulating layer 140 is formed on the top surface of the substrate 110 so as to surround and cover lateral surfaces of the first semiconductor chip 130. In one embodiment, the insulating layer 140 contacts the first semiconductor chip 130 at lateral, side surfaces of the semiconductor chip 130. The insulating layer 140 covers the first and second bonding pads 114a and 114b while exposing outermost edges of the substrate 110.

In this embodiment, the insulating layer 140 may have a top surface at the same level as a top surface of the first semiconductor chip 130. As such, the insulating layer 140 may have a thickness in a vertical direction that is equal to a sum of thicknesses of the insulating adhesive 120 and the first semiconductor chip 130. Thus, the top surface of the first semiconductor chip 130 may be exposed. However, the insulating layer 140 is not limited thereto and may have a top surface that is higher than the top surface of the first semiconductor chip 130, exposing or covering the top surface of the first semiconductor chip 130.

The insulating layer 140 may contain, for example, polymers such as polyimide or epoxy resins. The insulating layer 140 may be formed, for example, of a dry film (DF) or using a molding, coating, or screen printing technique.

Figure 4:
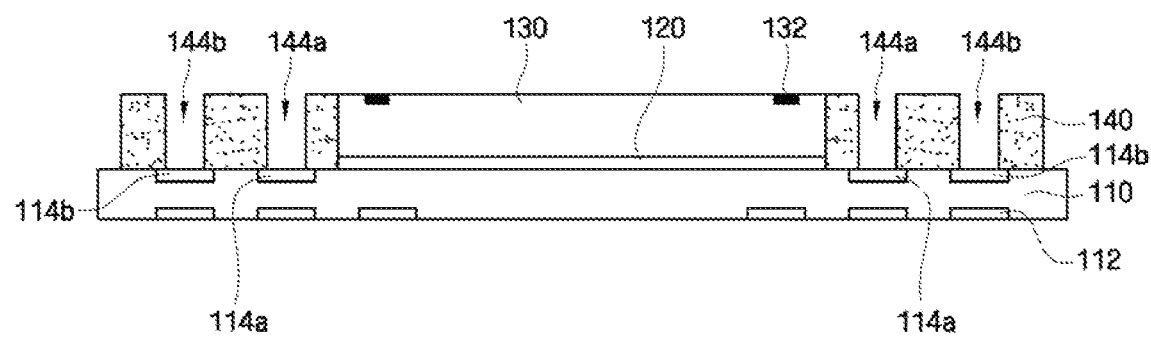
Figure 5:
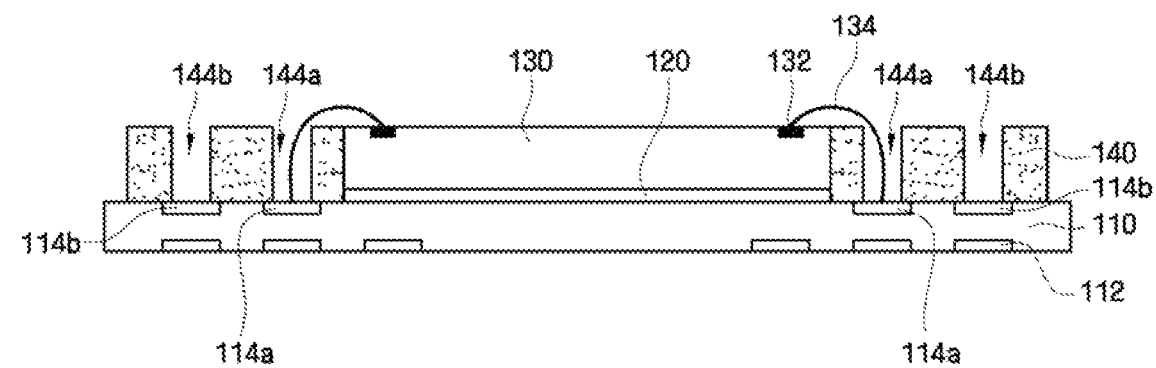

Referring to FIGS. 1A and 4, by removing a portion of the insulating layer 140, first openings 144a and the second openings 144b are formed in the insulating layer 140 so as to expose the first and second bonding pads 114a and 114b, respectively.

The first openings 144a and the second openings 144b have the shape of a hole vertically penetrating the insulating layer 140. Referring to FIG. 1A, the first openings 144a and the second openings 144b have a rectangular shape in a plane, but are not limited thereto. The first openings 144a and the second openings 144b may have various other planar shapes such as circular, oval, or quadrilateral shapes. In one embodiment, the portion of insulating layer 140 may be removed, for example, by a laser drilling process.

The first openings 144a and the second openings 144b may be formed simultaneously or sequentially.

The first openings 144a and the second openings 144b are arranged respectively corresponding to the first and second bonding pads 114a and 114b. Thus, as described above, when the plurality of first bonding pads 114a are disposed at opposite sides of the first semiconductor chip 130 and the plurality of second bonding pads 114b are arranged outside the first bonding pads 114a and at opposite sides of the second semiconductor chip 160 to be described later, the plurality of first openings 144a may be formed in the insulating layer 140 at opposite sides of the first semiconductor chip 130 while the plurality of second openings 144b may be formed at opposite sides of the first openings 144a and at opposite sides of the second semiconductor chip 160 in the insulating layer 140.

Although not shown in FIGS. 1A through 8, in an embodiment where the insulating layer 140 covers the first semiconductor chip 130, an opening other than the first and second openings 144a and 144b may be formed in the insulating layer 140 to expose the chip pad 132. The opening other than the first and second openings 144a and 144b may be formed simultaneously with or sequentially to the first and second openings 144a and 144b, for example, by laser drilling.

Referring to FIGS. 1A and 5, wire bonding is performed to electrically connect the first semiconductor chip 130 with the substrate 110. More specifically, the chip pads 132 on the first semiconductor chip 130 are connected to the corresponding first bonding pads 114a on the substrate 110 by wires 134 passing through the first openings 144a so as to electrically connect the first semiconductor chip 130 with the substrate 110.

Although the first semiconductor chip 130 is mounted on the substrate 110 by wire bonding according to the present embodiment, the present invention is not limited thereto and the first semiconductor chip 130 may be mounted on the substrate 110 in various other ways. For example, the first semiconductor chip 130 may be mounted on the substrate 110 by flip-chip bonding (See FIG. 10A through FIG. 16), or may be mounted using through vias such as through-silicon vias (TSVs). In addition, the wire bonding described above need not be performed after forming the insulating layer 140. For example, the wire bonding can be performed after the first semiconductor chip 130 is mounted on the substrate 110 but before the insulating layer 140 is formed. The insulating layer 140 can then be formed to cover and surround a portion of the wires 134 connected to the first bonding pads 114a.

Figure 6:
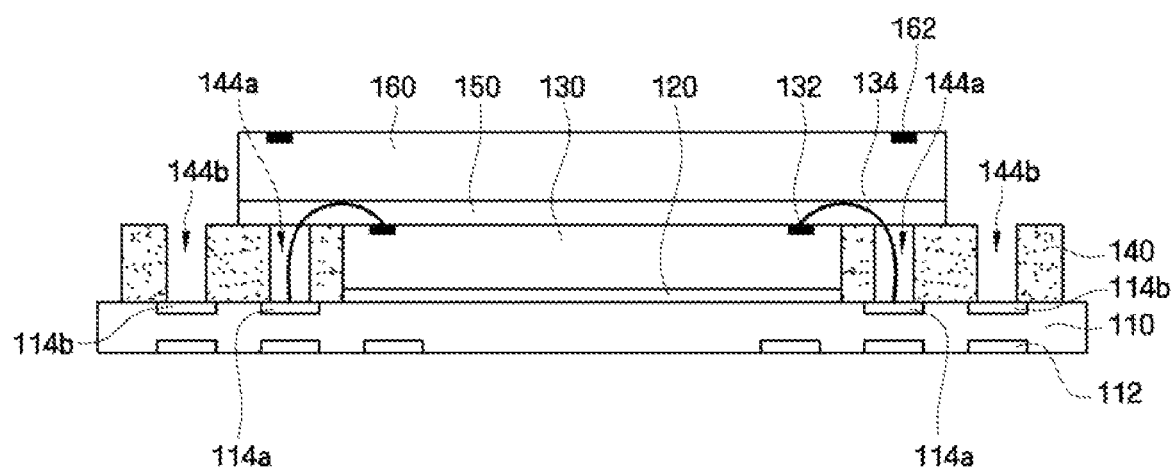

Referring to FIGS. 1B and 6, the second semiconductor chip 160 is formed on the structure of FIG. 5 having the first semiconductor chip 130 mounted on the substrate 110 and the insulating layer 140 surrounding the lateral surfaces of the first semiconductor chip 130. For example, the second semiconductor chip 160 may be attached onto the structure of FIG. 5 by an insulating adhesive 150. The insulating adhesive 150 may surround and cover a portion of wires 134 connected to the chips pads 132, and may cover part or all of openings 144a. The second semiconductor chip 160 also includes chip pads 162 formed on a top surface thereof.

In one embodiment, the second semiconductor chip 160 has a larger area than the first semiconductor chip 130 by overlapping the first semiconductor chip 130 in the horizontal direction. Thus, when the second semiconductor chip 160 is stacked on the first semiconductor chip 130, the second semiconductor chip 160 includes an overlapping portion supported by the first semiconductor chip 130 and a non-overlapping portion not supported by the first semiconductor chip 130. For convenience of explanation, the non-overlapping portion of the second semiconductor chip 160 is hereinafter called an "overhang portion". In the present embodiment, the overhang portion of the second semiconductor chip 160 is supported by the insulating layer 140 surrounding the first semiconductor chip 130, thereby facilitating a subsequent wire bonding process for connecting the second semiconductor chip 160 with the substrate 110, which will be described in more detail below. The insulating layer 140 is also referred to herein as a "support layer."

The non-overlapping portion of the second semiconductor chip 160 may overhang all edges of the first semiconductor chip 130, as shown in FIGS. 1A and 1B, but such an arrangement is not required. In other embodiments, the non-overlapping portion may only overhang two edges, or only one edge of the first semiconductor chip 130. For example, the second semiconductor chip 160 may have a greater length than the first semiconductor chip 130 in a first direction (e.g., in the horizontal direction A-A'), but they may have the same width in a second direction (e.g., perpendicular to the horizontal direction A-A'). Or, in other embodiments, semiconductor chips may be aligned so that only one edge of the second semiconductor chip 160 overhangs a corresponding edge of the first semiconductor chip 130 in a first direction (e.g., chips can have the different lengths but have one edge aligned, or can have the same lengths and be arranged in a step-wise manner, such that only one edge of the upper chip overhangs a corresponding edge of the lower chip).

The second semiconductor chip 160 includes the overhang portion, which exposes the second openings 144b so as to connect the second semiconductor chip 160 with the substrate 110 by wire bonding. In one embodiment, the overhang portion of the second semiconductor chip 160 is formed to expose the second openings 144b while completely covering the first openings 144a. Alternatively, the overhang portion of the second semiconductor chip 160 may be located to cover only a portion of the first opening 144a or expose the whole first opening 144a.

Furthermore, the center of the second semiconductor chip 160 in the horizontal direction may substantially coincide with the center of the first semiconductor chip 130. However, other alignments may be provided.

Figure 7:
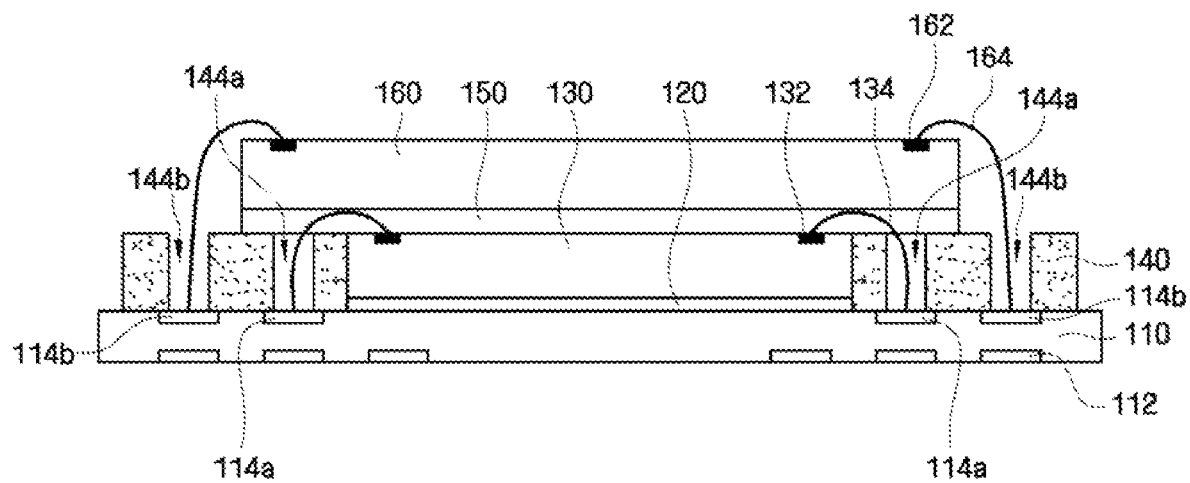

Referring to FIGS. 1B and 7, a wire bonding process is performed to electrically connect the second semiconductor chip 160 with the substrate 110. More specifically, the second semiconductor chip 160 is electrically connected with the substrate 110 by connecting chip pads 162 on the semiconductor chip 160 with the second bonding pads 114b on the substrate 110 by wires 164 passing through the second openings 144b.

As described above, the second semiconductor chip 160 may be mounted on the substrate 110 by wire bonding. As such, the overhang portion of the second semiconductor chip 160 is supported by the insulating layer 140. Thus, the magnitude of a force applied during the wire bonding process can be increased, thereby increasing the reliability of wire bonding. Since the overhang portion of the second semiconductor chip 160 is still supported by the insulating layer 140 even though a force applied during the wire bonding is increased, it is possible to prevent the occurrence of failure such as cracks in the second semiconductor chip 160, while improving the reliability of wire bonding.

Figure 8:
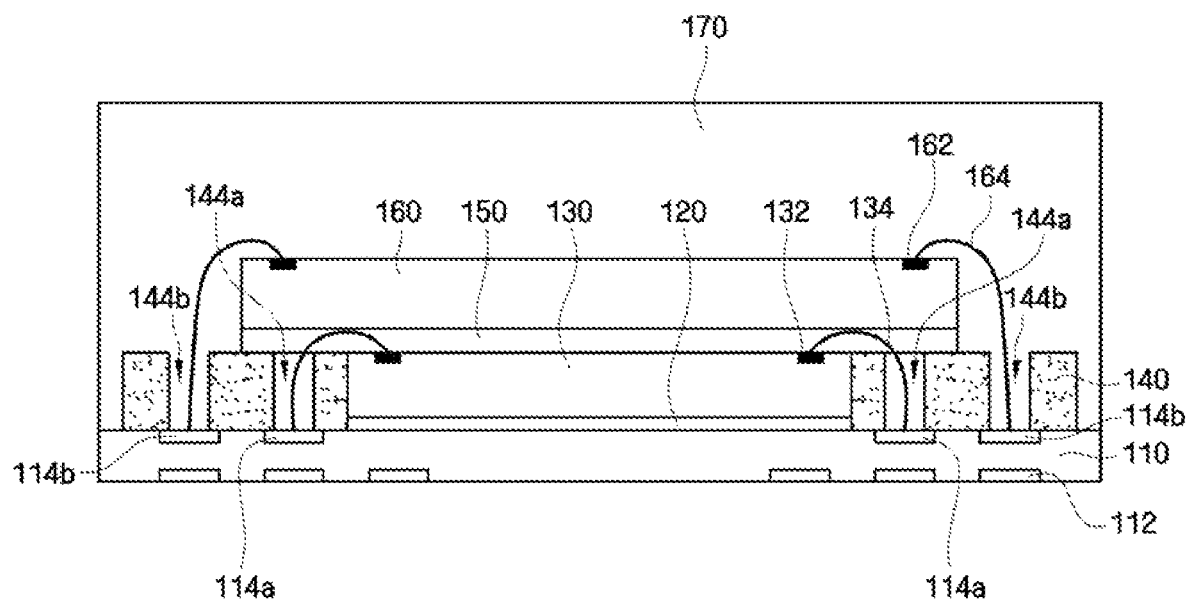

Referring to FIGS. 1B and 8, a molding material 170 is formed on an entire surface of the structure of FIG. 7 in which the first and second semiconductor chips 130 and 160 have been vertically and sequentially stacked and electrically connected to the substrate 110 by wire bonding. Thus, the molding material 170 encapsulates lateral and top surfaces of the first and second semiconductor chips 130 and 160 and the insulating layer 140. The molding material 170 may include, for example, epoxy-based resin or polyimide. After forming the molding material 170, fabrication of the MCP according to one embodiment is completed.

The method of fabricating an MCP according to the above-described embodiment allows the overhang portion of the second semiconductor chip 160 to be supported by the underlying insulating layer 140, thereby preventing the occurrence of failure during a wire bonding process for electrically connecting the second semiconductor chip 160 with the substrate 110. Furthermore, according to this embodiment, wire bonding and placing the second chip 160 on the first chip is performed after forming the insulating layer 140 and forming openings in the insulating layer 140 by laser drilling, thereby allowing an MCP to be fabricated in an easy and simplified manner.

The structure of an MCP according to one embodiment is now described with reference to FIGS. 1A, 1B, and 8. The structure of the MCP illustrated in FIG. 8 may be fabricated using the processes described with reference to FIGS. 2 through 7 and is not limited thereto. That is, the structure of the MCP may be fabricated using other processes than those described with reference to FIGS. 2 through 7.

Referring to FIGS. 1A, 1B, and 8, the substrate 110 includes first and second bonding pads 114a and 114b formed on a top surface thereof and a plurality of external connection terminals 112 formed on a bottom surface thereof. The plurality of first bonding pads 114a are arranged at opposite sides of the first semiconductor chip 130. Similarly, the plurality of second bonding pads 114b are arranged at opposite sides of the first bonding pads 114a and at opposite sides of the second semiconductor chip 160.

The insulating layer 140 is formed on the top surface of the substrate 110 so as to surround at least lateral surfaces of the first semiconductor chip 130 while exposing outermost edges of the substrate 110. The insulating layer 140 includes the first and second openings 144a and 144b respectively exposing the first and second bonding pads 114a and 114b. Alternatively, as discussed above, the insulating layer 140 may only include second openings 144b. The first and second openings 144a and 144b respectively correspond to the first and second bonding pads 114a and 114b. Thus, the plurality of first openings 144a are formed in the insulating layer 140 at opposite sides of the first semiconductor chip 130. Similarly, the plurality of second openings 144b are formed in the insulating layer 140 at opposite sides of the first openings 144a and at opposite sides of the second semiconductor chip 160. The first semiconductor chip 130 is attached onto the substrate 110 by the insulating adhesive 120 and circuitry in the first semiconductor chip 130 is connected with the chip pads 132 formed thereon so as to electrically connect to the first bonding pads 114a by the wires 134 passing through the first openings 144a.

The second semiconductor chip 160 is disposed on the first semiconductor chip 130 and the insulating layer 140. In this case, since the second semiconductor chip 160 has a larger area than the first semiconductor chip 130 in the horizontal direction, it has an overhang portion not overlapping the first semiconductor chip 130. The overhang portion is formed on the insulating layer 140 and does not cover the second openings 144b. Furthermore, in the embodiment shown in FIG. 8, the overhang portion of the second semiconductor chip 160 covers the first opening 144a. However, as described above, the overhang portion of the second semiconductor chip 160 may cover only a portion of the first opening 144a or expose the entire first opening 144a (See FIGS. 17 and 18). The second semiconductor chip 160 is attached onto the first semiconductor chip 130 and the insulating layer 140 by the insulating adhesive 150 and circuitry in the second semiconductor chip 160 is connected with the chip pads 162 formed thereon so as to electrically connect to the second bonding pads 114b using the wires 164 penetrating the second openings 144b.

The molding material 170 is formed on the entire structure of the substrate 110 having formed thereon the insulating layer 140 and the second semiconductor chip 160 so as to surround and encapsulate the insulating layer 140 and the second semiconductor chip 160. In one embodiment, the molding material 170 contacts the second semiconductor chip 160 and the insulating layer 140, but does not contact the first semiconductor chip 130.

The semiconductor chips 130 and 160, and other semiconductor chips described herein may be, for example, memory chips, logic chips, or combinations thereof, and may be, for example, master chips, slave chips, or controller chips. For example, in one embodiment, chip 160 may be a master controller chip that includes memory and logic, and chip 130 may be a slave memory chip. However, other combinations of types of chips may be implemented according to the disclosed embodiments.

Figure 9A:
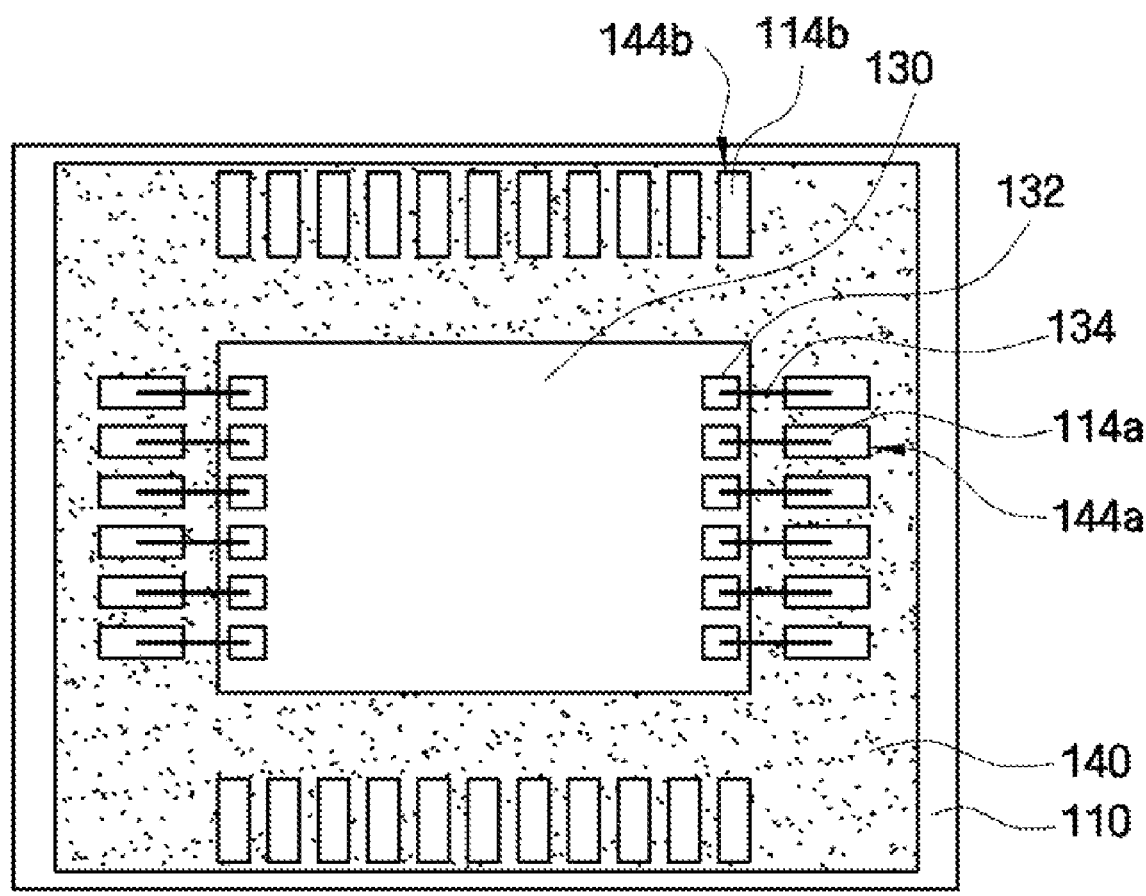
FIGS. 9A and 9B are plan views for explaining a method of manufacturing a MCP according to another exemplary embodiment.
Figure 9B:
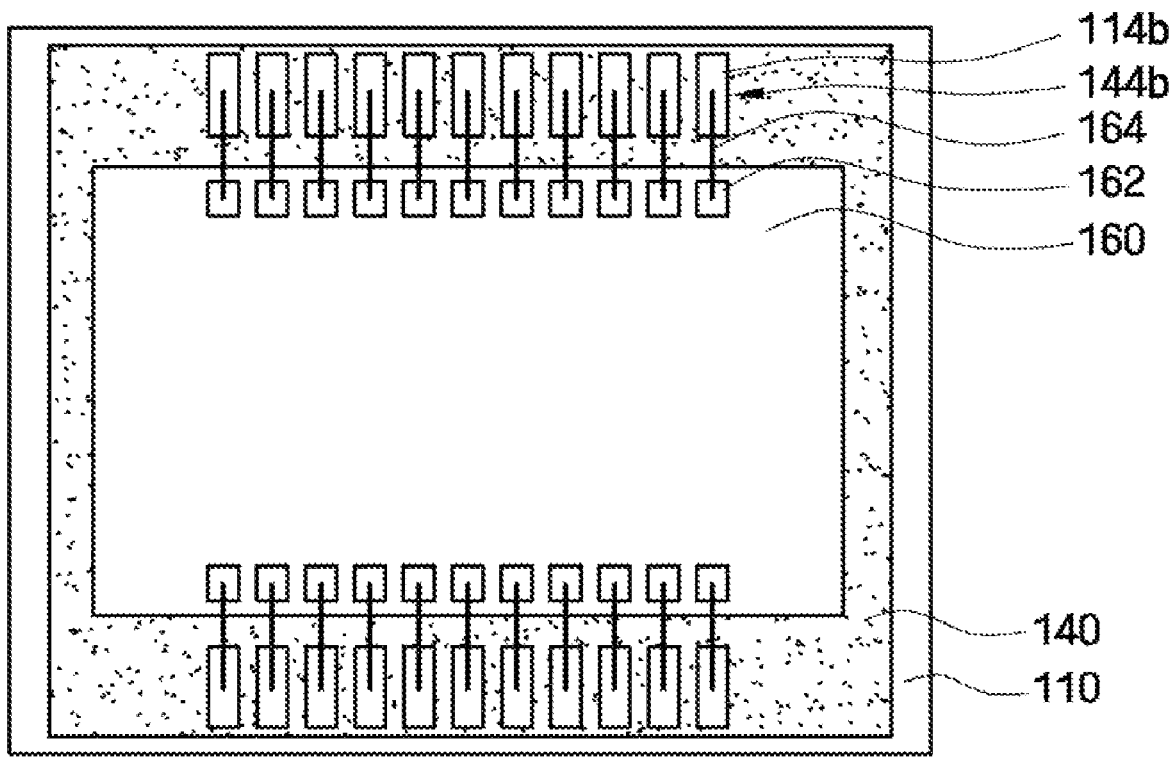

Next, a structure of an MCP and a method of manufacturing the MCP according to another embodiment are described with reference to FIGS. 2 through 8 and 9A and 9B. FIGS. 9A and 9B are plan views for explaining a method of manufacturing a MCP according to another exemplary embodiment Specifically, FIG. 9A is a plan view corresponding to a cross-sectional view such as shown in FIG. 5 and FIG. 9B is a plan view corresponding to a cross-sectional view such as shown in FIG. 7. The method of manufacturing the MCP according to one embodiment is now described with reference to the plan views and the cross-sectional views of FIGS. 1A through 9B according to an exemplary order in which fabrication processes are performed. Furthermore, detailed descriptions of structures or processes which are substantially the same as described with reference to FIGS. 1A through 8 will not be given to avoid redundancy.

Referring to FIGS. 9A and 2, a substrate 110 having first and second bonding pads 114a and 114b on a top surface thereof and external connection terminals 112 on a bottom surface thereof is provided. A plurality of first bonding pads 114a may be disposed at opposite sides of a first semiconductor chip 130. A plurality of second bonding pads 114b may be disposed at opposite sides of a second semiconductor chip 160. In one embodiment, the first bonding pads 114a are arranged at opposite sides of the first semiconductor chip 130 in a transverse direction while the second bonding pads 114b are arranged at opposite sides of the second semiconductor chip 160 in a longitudinal direction. That is, unlike in the embodiment described with reference to FIGS. 1A through 8, according to the embodiment of FIGS. 9A and 9B, the first and second bonding pads 114a and 114b may be arranged in different directions from each other with respect to the first and second semiconductor chips 130 and 160.

Next, the first semiconductor chip 130 is formed on the substrate 110.

Figure 3:
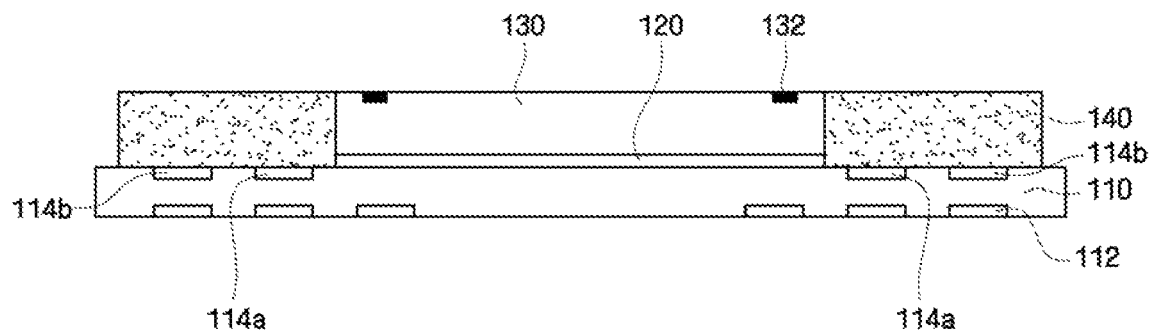

Referring to FIGS. 9A and 3, an insulating layer 140 is formed on the substrate 110 so as to surround lateral surfaces of the first semiconductor chip 130. The insulating layer 140 covers the first and second bonding pads 114a and 114b while exposing outermost edges of the substrate 110.

Referring to FIGS. 9A and 4, by removing a portion of the insulating layer 140, first and second openings 144a and 144b shown in FIG. 9A are formed in the insulating layer 140 so as to expose the first and second bonding pads 114a and 114b, respectively.

The first and second openings 144a and 144b are provided respectively corresponding to the first and second bonding pads 114a and 114b. Thus, the plurality of first openings 144a may be formed in the insulating layer 140 at opposite sides of the first semiconductor chip 130 in the transverse direction while the plurality of second openings 144b may be formed in the insulating layer 140 at opposite sides of the second semiconductor chip 160 in the longitudinal direction.

Referring to FIGS. 9A and 5, a wire bonding process is performed to electrically connect the first semiconductor chip 130 with the substrate 110. As described previously, in one embodiment, the wire bonding may be performed prior to forming the insulating layer 140.

Referring to FIGS. 9A and 6, the second semiconductor chip 160 is formed on the structure of FIG. 5 having the first semiconductor chip 130 mounted on the substrate 110 and the insulating layer 140 surrounding the lateral surfaces of the first semiconductor chip 130.

In this case, the overhang portion of the second semiconductor chip 160 may expose the second openings 144b while completely covering the first openings 144a. In another embodiment, the overhang portion of the second semiconductor chip 160 may not cover the second openings 144b while completely exposing the first opening 144a (See FIG. 17). Alternatively, the overhang portion of the second semiconductor chip 160 may not cover the second openings 144b while exposing a portion of the first opening 144a (See FIG. 18).

Referring to FIGS. 9B and 7, a wire bonding process is performed to electrically connect the second semiconductor chip 160 with the substrate 110.

Referring to FIGS. 9B and 8, a molding material 170 is formed on the entire surface of the structure of FIG. 7. By forming the molding material 170, fabrication of the MCP is completed.

Figure 10A:
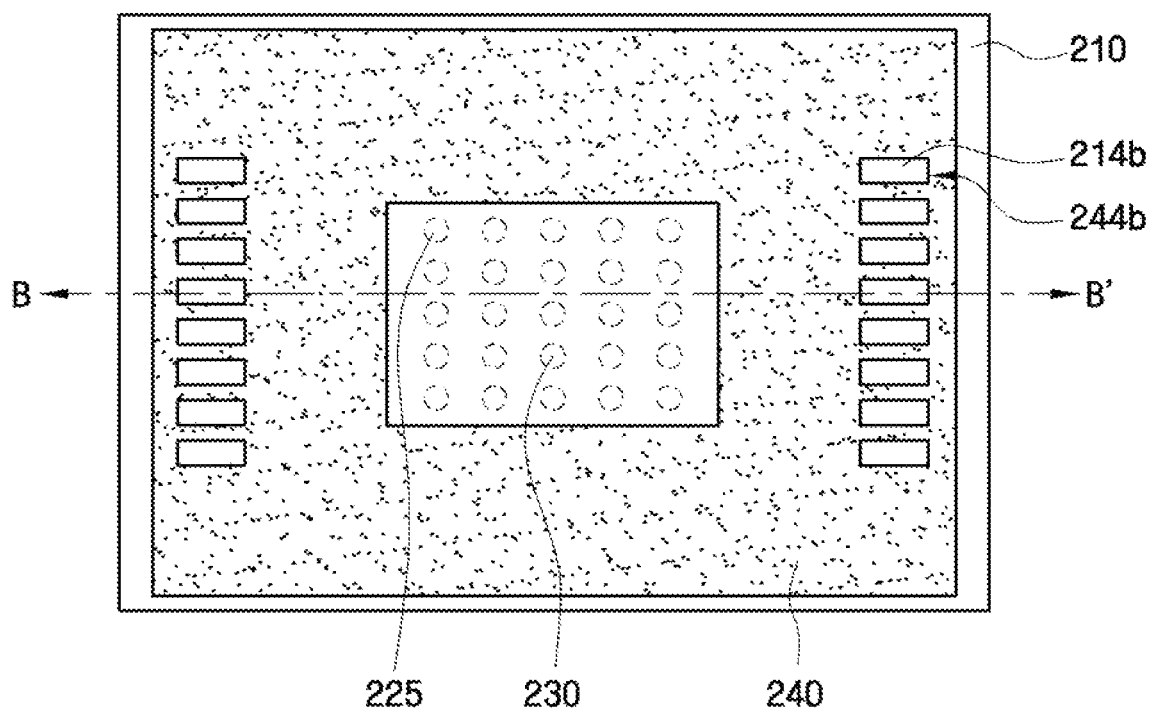
FIGS. 10A through 16 are plan views and cross-sectional views for explaining a method of manufacturing a MCP according to another exemplary embodiment.
Figure 10B:
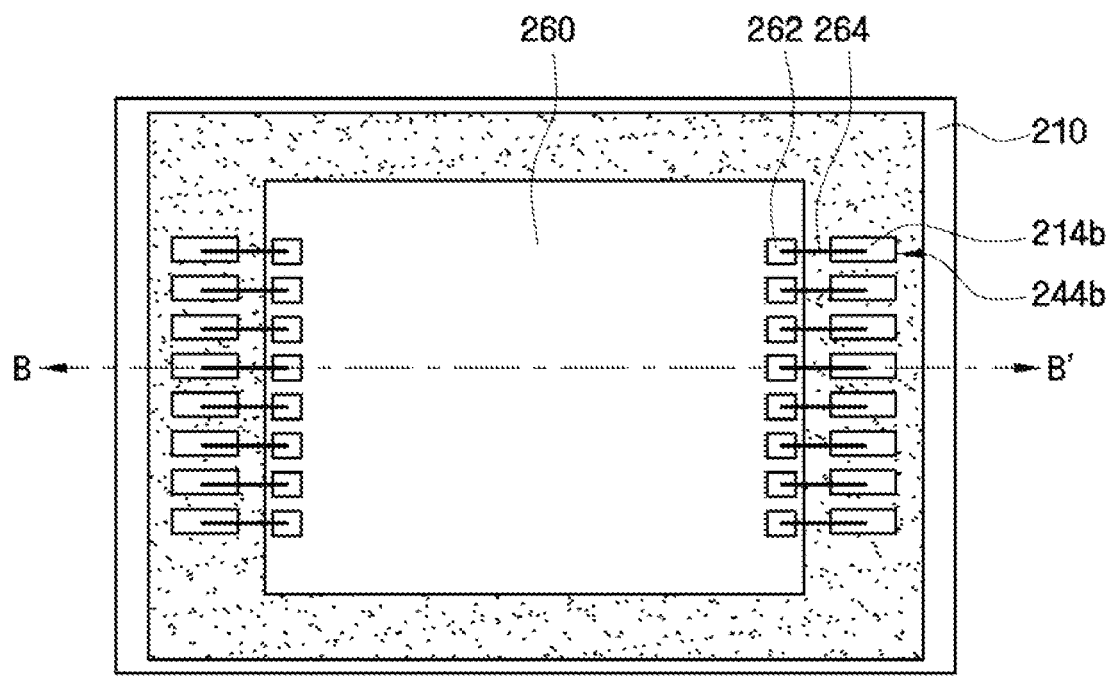

Next, the structure of an MCP and a method of manufacturing the MCP according to another embodiment are described with reference to FIGS. 10A through 16. FIGS. 10A and 10B are plan views for explaining a method of manufacturing a MCP according to one embodiment and FIGS. 11 through 16 are cross-sectional views taken along the line B-B' of FIGS. 10A and 10B. Here, FIG. 10A is a plan view corresponding to a cross-sectional view of FIG. 13 and FIG. 10B is a plan view corresponding to a cross-sectional view of FIG. 15. The method of manufacturing the MCP according to one embodiment is now described with reference to the plan views and the cross-sectional views of FIGS. 10A through 16 according to an exemplary order in which fabrication processes are performed. Furthermore, detailed descriptions of structures or processes which are substantially the same as described with reference to FIGS. 1A through 8 will not be given to avoid redundancy.

Figure 11:
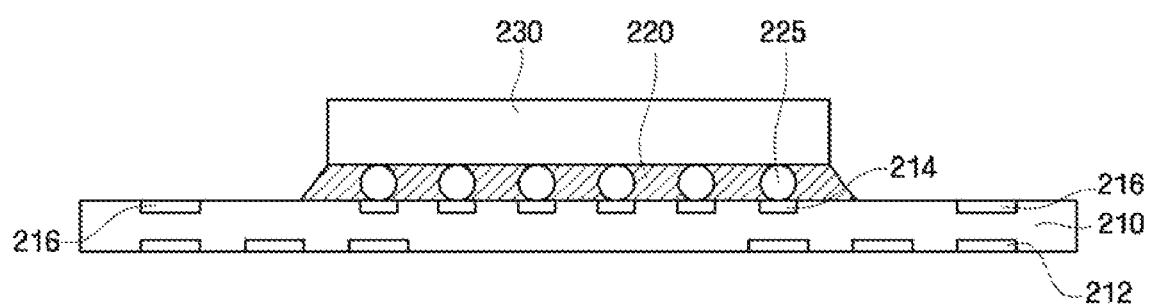

Referring to FIGS. 10A and 11, a substrate 210 having first and second bonding pads 214 and 216 on a top surface thereof and external connection terminals 212 on a bottom surface opposite the top surface is provided. The first and second bonding pads 214 and 216 are intended to electrically connect to semiconductor chips 230 and 260 that will be described later. The external connection terminals 212 serve to electrically connect the MCP (See FIG. 16) according to one embodiment with an external device outside the MCP. As will be described later, the plurality of first bonding pads 214 are arranged on the top surface of the substrate 210 corresponding to a region in which the first semiconductor chip 230 is formed. The plurality of second bonding pads 216 may be disposed at opposite sides of the second semiconductor chip 260 that will be described later.

Next, the first semiconductor chip 230 is formed on the substrate 210. In this case, the first semiconductor chip 230 may be mounted on the substrate 210 by flip-chip bonding.

In a flip-chip bonding process, the plurality of first bonding pads 214 may be disposed on the top surface of the substrate 210 corresponding to the first semiconductor chip 230 so as to underlie the first semiconductor chip 230. Furthermore, a plurality of conductive chip bumps 225 are disposed on a bottom surface of the first semiconductor chip 230. For example, the plurality of conductive chip bumps 225 may be formed so as to contact I/O pads that connect to internal circuitry on the first semiconductor chip 230. The plurality of chip bumps 225 are attached to the corresponding plurality of first bonding pads 214 so as to electrically connect the first semiconductor chip 230 with the substrate 210. An under-fill material 220 is buried between the first semiconductor chip 230 and the substrate 210. The under-fill material 220 surrounds and protects the chip bumps 225 disposed between the first semiconductor chip 230 and the substrate 210, thereby increasing the adhesion strength between the first semiconductor chip 230 and the substrate 210. The under-fill material 220 may be, for example, an insulating material.

Figure 12:
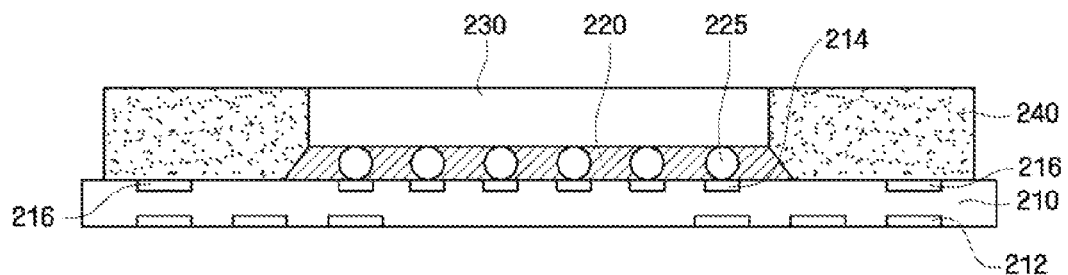
Figure 13:
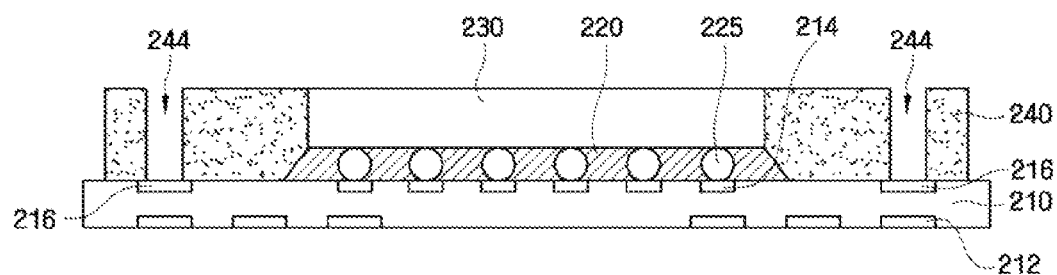

Referring to FIGS. 10A and 12, an insulating layer 240 is formed on the substrate 210 so as to surround lateral surfaces of the first semiconductor chip 230 and under-fill material 220. The insulating layer 240 covers the second bonding pads 216 while exposing outermost edges of the substrate 210. In one embodiment, the insulating layer 240 may have a top surface at the same level as a top surface of the first semiconductor chip 230. Thus, the top surface of the first semiconductor chip 230 may be exposed. However, the insulating layer 240 is not limited thereto and may have a top surface that is higher than the top surface of the first semiconductor chip 230, exposing or covering the top surface of the first semiconductor chip 230.

Referring to FIGS. 10A and 13, by removing a portion of the insulating layer 240, openings 244 are formed in the insulating layer 240 so as to expose the second bonding pads 216. The openings 244 may have the shape of a hole vertically penetrating the insulating layer 240. The portion of insulating layer 240 may be removed, for example, by a laser drilling process in order to form the openings 244.

Unlike in the embodiment described with reference to FIGS. 1A through 8, since the first semiconductor chip 230 is already electrically connected to the substrate 210 by the chip bumps 225, subsequent wire bonding is not required for the first semiconductor chip 230. Thus, as shown in FIGS. 10A and 13, the openings 244 can only be formed so as to expose the second bonding pad 216.

In one embodiment, the plurality of openings 244 corresponding to the second bonding pads 216 are formed in the insulating layer 240 at opposite sides of the second semiconductor chip 260.

Figure 14:
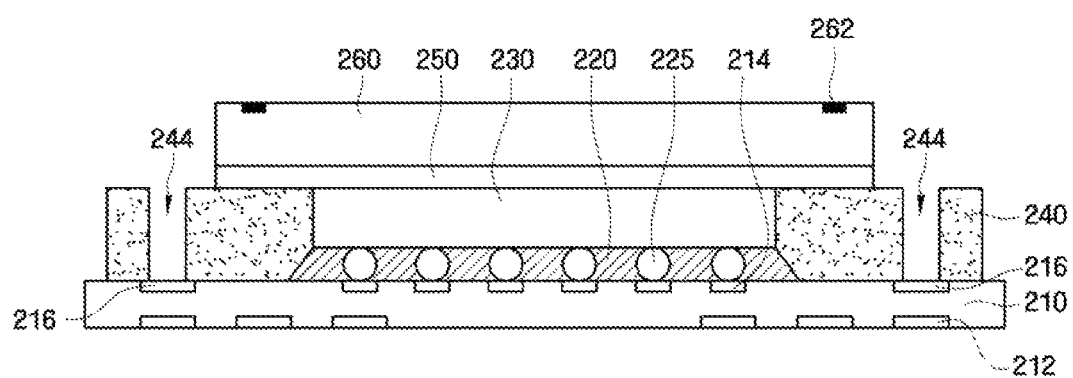

Referring to FIGS. 10B and 14, the second semiconductor chip 260 is formed on the structure of FIG. 13 having the first semiconductor chip 230 mounted on the substrate 210 and the insulating layer 240 surrounding the lateral surfaces of the first semiconductor chip 230. For example, the second semiconductor chip 260 may be attached onto the structure of FIG. 13 by an insulating adhesive 250. The second semiconductor chip 260 also includes chip pads 262 formed on a top surface thereof.

In this embodiment, the second semiconductor chip 260 has a larger area than the first semiconductor chip 230 by overlapping the first semiconductor chip 230 in the horizontal direction. Thus, the second semiconductor chip 260 includes an overhang portion not overlapping the first semiconductor chip 230 and supported by the insulating layer 240.

In one embodiment, the center of the second semiconductor chip 260 in the horizontal direction may substantially coincide with the center of the first semiconductor chip 230. The overhang portion of the semiconductor chip 260 is also formed so as not to cover the openings 244.

Figure 15:
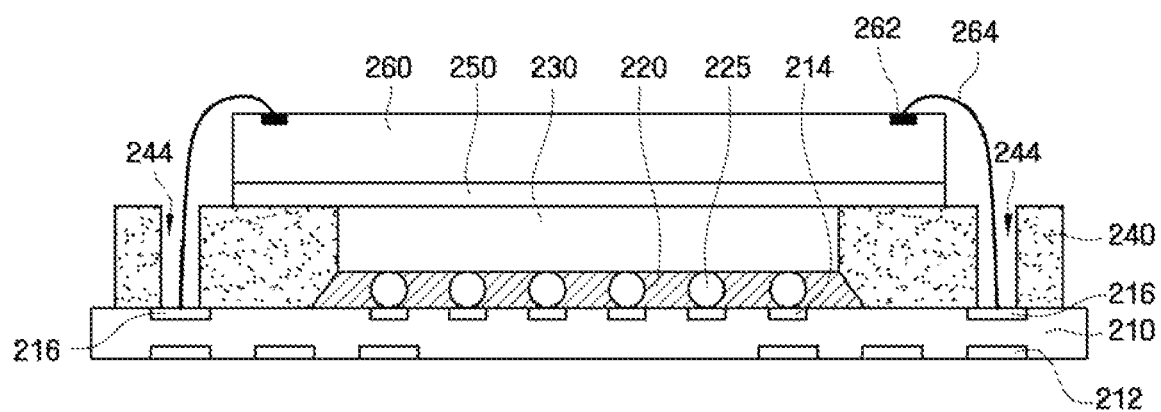

Referring to FIGS. 10B and 15, a wire bonding process is performed to electrically connect the second semiconductor chip 260 with the substrate 210. More specifically, the second semiconductor chip 260 is electrically connected with the substrate 210 by connecting chip pads 262 on the second semiconductor chip 260 with the second bonding pads 216 on the substrate 210 by wires 264 passing through the openings 244.

Figure 16:
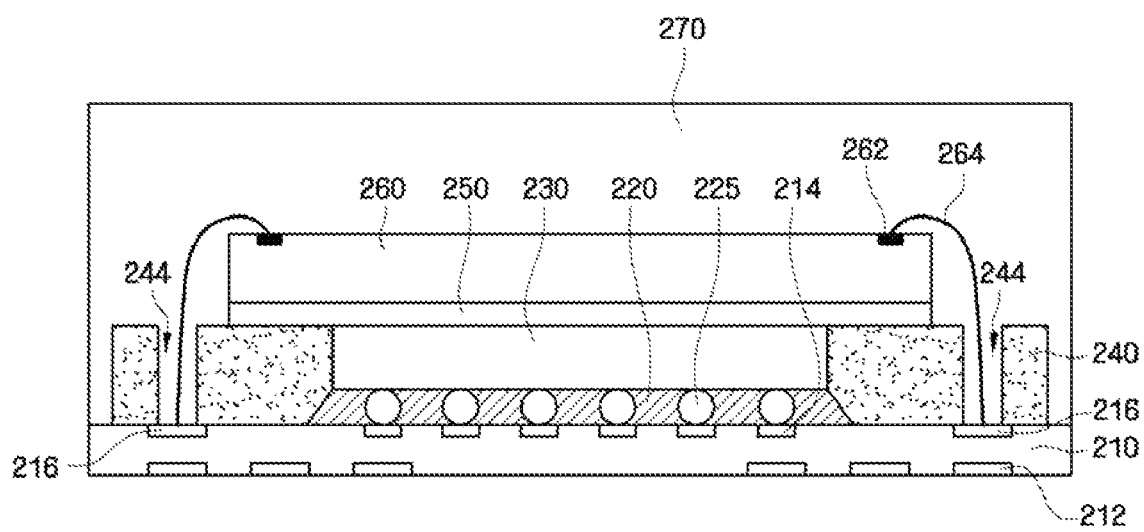

Referring to FIGS. 10B and 16, a molding material 270 is formed on the entire surface of the structure of FIG. 15 in which the first and second semiconductor chips 230 and 260 have been vertically and sequentially stacked and electrically connected to the substrate 210 by flip-chip bonding and wire bonding, respectively. After forming the molding material 270, fabrication of the MCP is completed.

The structure of the MCP according to the present embodiment is now described with reference to FIGS. 10A, 10B, and 16. The structure of the MCP illustrated in FIG. 16 may be fabricated using the processes described with reference to FIGS. 11 through 15 and is not limited thereto. That is, the structure of the MCP illustrated in FIG. 16 may be fabricated using other processes than those described with reference to FIGS. 11 through 15.

Referring to FIGS. 10A, 10B, and 16, the substrate 210 includes the first and second bonding pads 214 and 216 formed on a top surface thereof and a plurality of external connection terminals 212 formed on a bottom surface thereof. The plurality of first bonding pads 214 underlie the first semiconductor chip 230 while the plurality of second bonding pads 216 are arranged at opposite sides of the second semiconductor chip 260.

The first semiconductor chip 230 and the insulating layer 240 surrounding at least lateral surfaces of the first semiconductor chip 230 are formed on the top surface of the substrate 210.

In this case, the plurality of chip bumps 225 are interposed between the first semiconductor chip 230 and the substrate 210. The plurality of chip bumps 225 are attached to the corresponding plurality of first bonding pads 214 so as to electrically connect the first semiconductor chip 230 with the substrate 210. The under-fill material 220 is buried between the first semiconductor chip 230 and the substrate 210 and surrounds and protects each of the chip bumps 225. The insulating layer 240 includes the openings 244 exposing the second bonding pads 216. The plurality of openings 244 corresponding to the second bonding pads 216 are formed in the insulating layer 240 at opposite sides of the second semiconductor chip 260.

The second semiconductor chip 260 is mounted on the first semiconductor chip 230 and the insulating layer 240. In this case, the second semiconductor chip 260 has a larger area than the first semiconductor chip 230 in the horizontal direction so includes an overhang portion not overlapping the first semiconductor chip 230. The overhang portion is located on the insulating layer 240 so as not to cover the openings 244. The second semiconductor chip 260 is attached onto the first semiconductor chip 230 and the insulating layer 240 by the insulating adhesive and electrically connected with the second bonding pads 216 by the wires 264 passing through the openings 244 and connecting to the chip pads 262 formed thereon.

The molding material 270 is formed on the entire structure including the insulating layer 240 and the second semiconductor chip 260.

Figure 17:
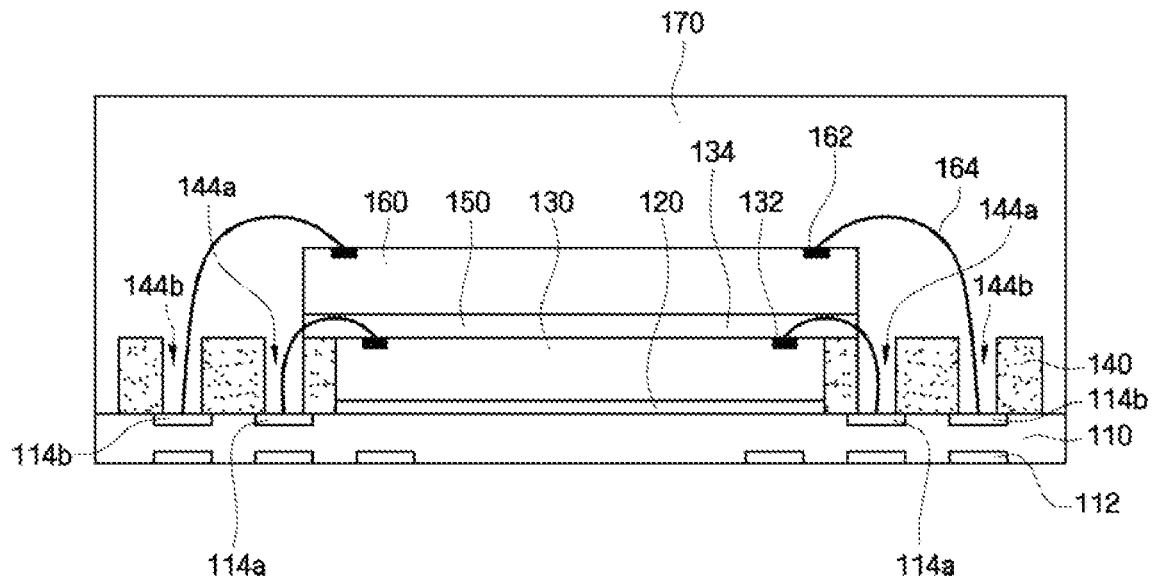
FIGS. 17 through 19 are plan views and cross-sectional views for explaining a method of manufacturing a MCP according to another exemplary embodiment.
Figure 18:
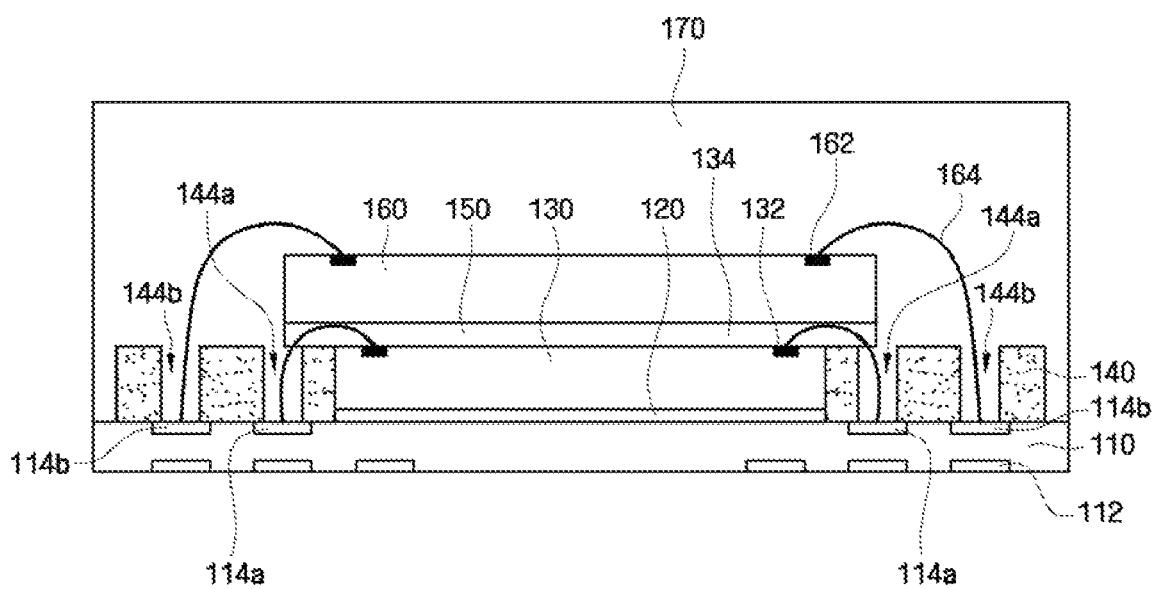
Figure 19:
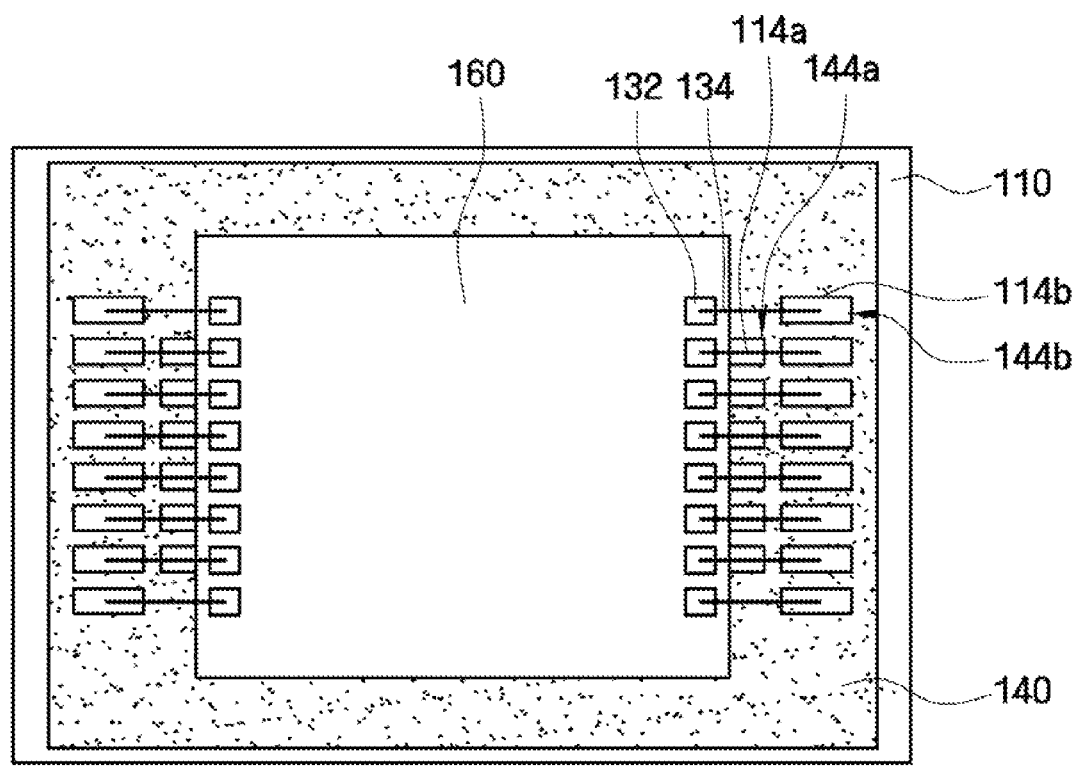

Next, an MPC and method of manufacturing the MCP according to another embodiment are described with reference to FIGS. 17 through 19. FIGS. 17 through 19 are plan views and cross-sectional views for explaining a method of manufacturing a MCP according to another embodiment. The method according to this embodiment is substantially the same as the method described with reference to FIGS. 1A through 8 except for processes illustrated in FIGS. 1B and 6.

Referring to FIG. 17, an overhang portion of a second semiconductor chip 260 is located so as not to cover second openings 144b while completely exposing the first openings 144a.

Referring to FIGS. 18 and 19, the overhang portion of the second semiconductor chip 260 may be located so as not to cover second openings 144b while exposing a portion of the first openings 144a.

Next, an MPC and method of manufacturing the MCP according to another embodiment are described with reference to FIGS. 20 through 23. FIGS. 20 through 23 are cross-sectional views illustrating intermediate processes in a method of manufacturing a MCP according to another embodiment.

Figure 20:
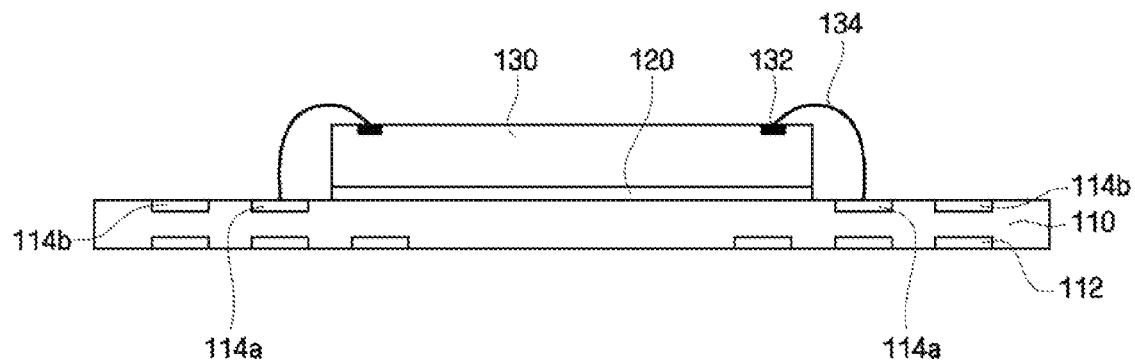
FIGS. 20 through 23 are cross-sectional views illustrating intermediate processes in a method of manufacturing a MCP according to another exemplary embodiment.

Referring to FIG. 20, a first semiconductor chip 130 is formed on the substrate 110 having first and second bonding pads 114a and 114b formed thereon, and chip pads 132 on the first semiconductor chip 130 connect with the first bonding pads 114a using wires 134.

Figure 21:
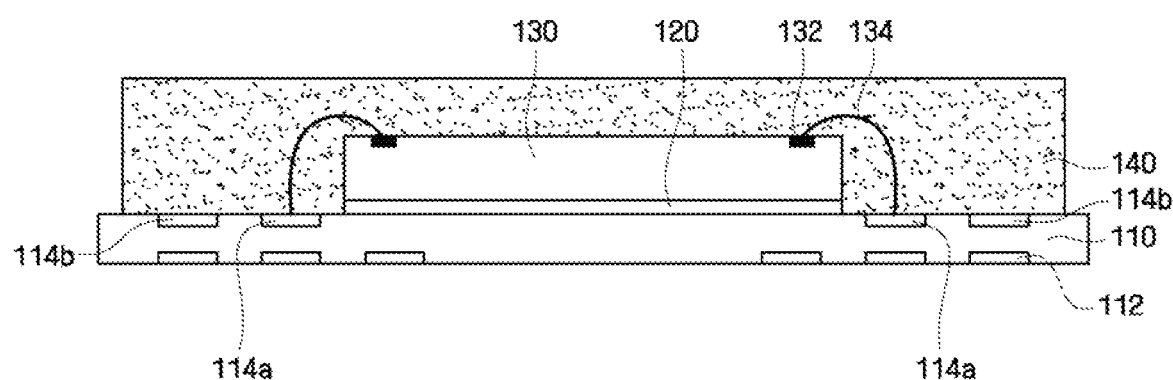

Referring to FIG. 21, the first semiconductor chip 130 and an insulating layer 140 surrounding at least lateral surfaces of the first semiconductor chip 130 are formed on the top surface of the substrate 110. Although the insulating layer 140 covers wires 134 as well as the first semiconductor chip 130, the present invention is not limited thereto. That is, the insulating layer 140 may expose part or all of the wires 134.

Figure 22:
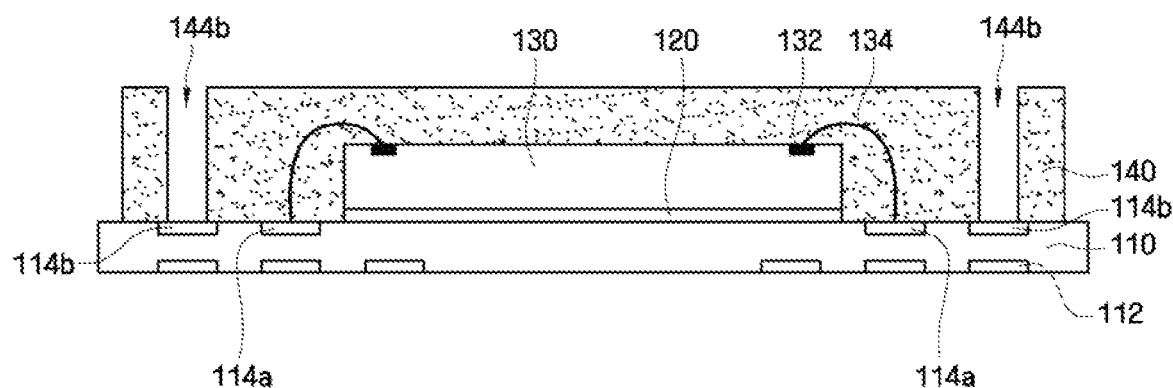

Referring to FIG. 22, openings 144b are formed in the insulating layer 140 so as to expose the second bonding pads 114b by removing a portion of the insulating layer 140.

Figure 23:
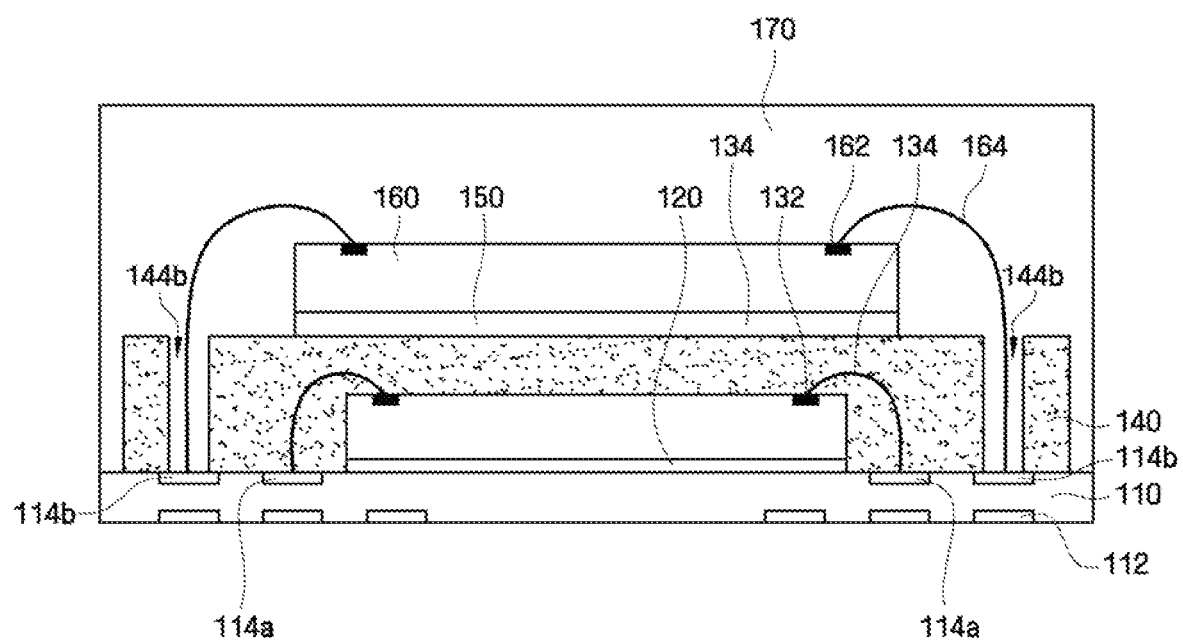

Referring to FIG. 23, a second semiconductor chip 160 is formed on the first semiconductor chip 130 and the insulating layer 140. Then, chip pads 162 on the second semiconductor chip 160 are connected to the second bonding pads 114b on the substrate 110 by wires 164.

Subsequently, a molding material 170 is formed on the entire surface of the structure in which the first and second semiconductor chips 130 and 160 have been vertically and sequentially stacked and electrically connected to the substrate 110 by wire bonding.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A multi-chip package comprising:
   a substrate having first and second bonding pads on a top surface thereof;
   a first chip connected to the first bonding pads on the substrate;
   an insulating layer formed on the substrate so as to surround lateral surfaces of the first chip;
   a set of openings formed in the insulating layer so as to expose the second bonding pads; and
   a second chip formed on the insulating layer and the first chip, the second chip having a larger area than the first chip and connected to the second bonding pads using wires that pass through respective ones of the openings.

2. The multi-chip package of claim 1, wherein the second bonding pads are disposed at opposite sides of the second chip in a first direction.

3. The multi-chip package of claim 2, wherein the first bonding pads are disposed at opposite sides of the first chip in the first direction while the second bonding pads are disposed at opposite sides of the first bonding pads in the first direction.

4. The multi-chip package of claim 2, wherein the first bonding pads are disposed at opposite sides of the first chip in a second direction intersecting the first direction.

5. The multi-chip package of claim 1, wherein the set of respective opening are second openings, and further comprising first openings formed in the insulating layer so as to expose the first bonding pads, wherein the first chip is connected to the substrate by wires penetrating the first openings.

6. The multi-chip package of claim 5, wherein the second chip does not cover the second openings but covers a portion of or the entire first openings.

7. The multi-chip package of claim 1, wherein the first bonding pads underlie the first chip and the first chip is connected to the first bonding pads by a conductive element interposed therebetween.

8. The multi-chip package of claim 1, wherein the insulating layer has a top surface at the same level as a top surface of the first chip.

9. The multi-chip package of claim 1, wherein the insulating layer is formed so as to expose the top surface of the first chip.

10. The multi-chip package of claim 1, wherein the insulating layer is formed so as to expose outermost edges of the substrate.

11. The multi-chip package of claim 1, wherein the insulating layer includes epoxy resin or polyimide.

12. The multi-chip package of claim 1, wherein the insulating layer formed on the substrate covers the first chip.

13. The multi-chip package of claim 12, wherein the first chip connected to the first bonding pads by wires and the wires connecting the first chip to the first bonding pads are embedded in the insulating layer.

14. A multi-chip package comprising:
   a substrate having first and second bonding pads on a top surface thereof;
   a first chip connected to the first bonding pads on the substrate;
   a support layer formed on the substrate so as to surround one or more lateral surfaces of the first chip;
   a set of openings formed in the support layer so as to expose the second bonding pads; and
   a second chip formed on the support layer and the first chip, the second chip having a portion that overhangs the first chip and is connected to the second bonding pads using wires that pass through respective ones of the openings.

15. The multi-chip package of claim 14, wherein the second chip has a larger area than the first chip.

16. The multi-chip package of claim 14, wherein the support layer is formed of an insulating material and the set of openings are holes formed through the insulating material.

17. The multi-chip package of claim 14, wherein the portion that overhangs the first chip overhangs the first chip on at least two opposite ends of the first chip.

18. The multi-chip package of claim 17, wherein the set of respective opening are second openings, and further comprising first openings formed in the support layer so as to expose the first bonding pads, wherein the first chip is connected to the substrate by wires penetrating the first openings.

19. A method of manufacturing a multi-chip package, the method comprising:
   forming a substrate having first and second bonding pads on a top surface thereof;
   mounting a first chip on the substrate and connecting chip pads on the first chip to the first bonding pads on the substrate;
   forming an insulating layer on the substrate so as to surround lateral surfaces of the first chip;
   forming a set of openings in the insulating layer so as to expose the second bonding pads;
   mounting a second chip on the insulating layer and the first chip, the second chip having at least a portion that overhangs the first chip; and
   connecting chip pads on the second chip to the second bonding pads using wires that pass through respective ones of the openings.

20. The method of claim 19, wherein the second chip has a larger area than the first chip so that the second chip overlaps the entire first chip and the portion of the second chip that overhangs the first chip does not overlap the first chip.

* * * * *